(12) United States Patent
Dubreuil et al.

(10) Patent No.: US 8,098,697 B2
(45) Date of Patent: Jan. 17, 2012

(54) OPTICAL DEVICE FOR ADDRESSING A SLAVE CAVITY WITH A WIDE-BAND LASER SOURCE

(75) Inventors: Nicolas Dubreuil, Les Ulis (FR); Gilles Pauliat, Marcoussis (FR); Gérald Roosen, La Celle-les Bordes (FR)

(73) Assignee: Centre National de la Recherche Scientifique-CNRS, Paris Cedex (FR)

( * ) Notice: Subject to any disclaimer, the term of this patent is extended or adjusted under 35 U.S.C. 154(b) by 753 days.

(21) Appl. No.: 12/083,417

(22) PCT Filed: Oct. 12, 2006

(86) PCT No.: PCT/FR2006/002301
§ 371 (c)(1),
(2), (4) Date: Jul. 28, 2008

(87) PCT Pub. No.: WO2007/042678
PCT Pub. Date: Apr. 19, 2007

(65) Prior Publication Data
US 2009/0252183 A1    Oct. 8, 2009

(30) Foreign Application Priority Data
Oct. 13, 2005    (FR) ..................................... 05 10470

(51) Int. Cl.
*H01S 3/10* (2006.01)
(52) U.S. Cl. .............................. 372/20; 372/23; 372/97
(58) Field of Classification Search .................... 372/20, 372/23, 97
See application file for complete search history.

(56) References Cited

U.S. PATENT DOCUMENTS

| | | | |
|---|---|---|---|
| 4,635,246 A | 1/1987 | Taylor | |
| 5,097,478 A | 3/1992 | Verdiell et al. | |
| 5,121,400 A * | 6/1992 | Verdiell et al. | 372/32 |
| 5,347,525 A * | 9/1994 | Faris | 372/19 |
| 5,898,719 A | 4/1999 | Ryu | |
| 6,674,782 B2 | 1/2004 | Roosen et al. | |

(Continued)

FOREIGN PATENT DOCUMENTS
EP    0375021    6/1990
(Continued)

OTHER PUBLICATIONS

Dubreuil, N. et al.:Tunable Self-Adaptive Cavity Laser Diode With Wavelength All-Optical Addressing, Proceedings of the European Conference on Optical Communication, XX, XX, vol. 3, 2004, pp. 600-601, XP009060284, the whole document.

(Continued)

*Primary Examiner* — Kinam Park
(74) *Attorney, Agent, or Firm* — Harness, Dickey & Pierce, P.L.C.

(57) ABSTRACT

The invention concerns an optical device comprising an optical source for emitting a light beam in a plurality of emitting wavelengths and at least one laser, each of said at least one laser including a holographic medium (MH), means for injecting (FO, MCS, MUX, CO, IO, AV) said light beam derived from said optical source into said at least one laser, said holographic medium (MH) being adapted to generate a laser in at least one oscillation mode, said at least one oscillation mode being determined by at least one excitation wavelength among the plurality of emitting wavelengths. The invention is characterized in that said optical source comprises a light source emitting simultaneously in said plurality of emitting wavelengths.

19 Claims, 6 Drawing Sheets

U.S. PATENT DOCUMENTS

| | | |
|---|---|---|
| 7,519,092 B2 | 4/2009 | Dubreuil et al. |
| 2002/0006150 A1 | 1/2002 | Roosen et al. |
| 2004/0141533 A1 | 7/2004 | Lefevre et al. |

FOREIGN PATENT DOCUMENTS

| | | |
|---|---|---|
| EP | 0829935 A | 3/1998 |
| JP | 2000-209162 A | 7/2000 |

OTHER PUBLICATIONS

Coquin, G. A. et al: "Electronically Tunable External-Cavity Semiconductor Laser", Electronics Letters, IEE Stevenage, GB, vol. 24, No. 10, May 12, 1988, pp. 599-600, XP000096530, ISSN: 0013-5194, the whole document.

Maerten S. et al.: "Laser diode made single-mode by a self-adaptive photorefractive filter", Optics Communications, North-Holland Publishing Co., Amsterdam, NL, vol. 208, No. 1-3, Jul. 1, 2002, pp. 183-189, XP004369127, ISSN: 0030-4018, the whole document.

Huot, N. et al.: "Laser Mode Manipulation by Intracavity Dynamic Holography: Application to Mode Selection", Applied Physics B: Lasers and Optics, Springer International, Berlin, DE, vol. B69, No. 2, Aug. 1999, pp. 155-157, XP000835085, ISSN: 0946-2171, the whole document.

* cited by examiner

OPTICAL DEVICE FOR ADDRESSING A SLAVE CAVITY WITH A WIDE-BAND LASER SOURCE

CROSS-REFERENCE TO RELATED APPLICATIONS

This application is a National Phase Entry of PCT/FR2006/002301, filed Oct. 12, 2006, which claims priority to French Application No. 05/10470, filed Oct. 13, 2005, both of which are incorporated by reference herein.

BACKGROUND AND SUMMARY

The present invention relates to an optical device comprising an optical source adapted to emit a light beam in a plurality of emitting wavelengths, at least one laser, each of said at least one laser including a holographic medium, means for injecting said light beam derived from said optical source into said at least one laser, said holographic medium being adapted to generate a hologram, so as to oscillate said at least one laser in at least one oscillation mode, said at least one oscillation mode being determined by at least one excitation wavelength among said plurality of emitting wavelengths.

Such type of device is known for example, from the publication by N. Dubreuil, G. Pauliat and G. Roosen "Tuneable Self-Adaptive Laser Diode with Wavelength All-Optical Addressing" (ECOC 2004 Proceedings—Vol. 3—Paper We4.P.065—p. 600-601), in which the optical source used is a tuneable so-called "master laser", a source of light having an important coherence length. Such master laser is used for addressing a cavity of a slave laser through the recording in a holographic material of the cavity. More precisely, when the beam derived from the master laser is injected into the cavity of the slave laser, the spectrum emitted by the latter is modified. The new structure of modes, which oscillates in the cavity of the slave laser, records a hologram in the dynamic holographic medium. Such hologram reduces the losses of the mode or the modes, which oscillates or oscillate in the cavity of the slave laser and enables to strengthen the operation of the slave laser in a particular mode. Upon cutting off the beam derived from the master source, the hologram persists and enables the slave laser to keep the wavelength imparted by the master source during the injection. Thus, the wavelength of the slave laser is determined by the optical injection of a beam derived from the master source and stored by the dynamic holographic medium inserted into the cavity of the slave laser. Such wavelength is then kept after the cut-off of the beam derived from the master slave. Thus, it is possible to address a second slave laser, possibly on a different wavelength, the first slave laser still oscillating according to the fixed wavelength.

However, this advantageous addressing method of a slave laser by a master laser has a certain number of disadvantages. First, when a master laser is used, it is necessary to adjust the wavelength of the laser in the neighbourhood of a mode of the slave laser cavity with the utmost accuracy, so that the injection condition is complied with. If the wavelength of the master laser is too far from that of a mode of the slave cavity, there won't be any destabilisation of the operation of the slave laser towards an operation in a wavelength neighbouring that of the master laser. It will be understood that such required adjustment of the wavelength of the tuneable laser is a disadvantage of the mounting such as described in the hereabove-mentioned publication.

A second disadvantage of the device, according to the prior art as mentioned hereabove, relates to the polarisation constraints between the master laser and the slave laser or lasers. As a matter of fact, in the case where the polarisation condition of the master laser is perpendicular to the polarisation condition of the slave laser, the operation of the slave laser is not disturbed by the beam derived from the master laser and no addressing can be performed. This is the reason why the mounting, according to the prior art mentioned hereabove, requires a polarisation tester in order to at least avoid the perpendicularity of the polarisation of the two lasers. It should be understood that the necessity of having such a tester is a disadvantage of the mounting according to the prior art mentioned above. In addition, in the situation where the physical relationship between the master laser and the slave laser is provided using an optical fibre, the fibre introduces a birefringence, which results in an action on the polarisation condition of the beams. It is thus necessary to compensate for such variations in birefringence by systematically adjusting the polarisation tester. It will thus be advantageous to eliminate the polarisation constraints between the master source and the slave cavity. A third disadvantage of the device, according to the prior art mentioned hereabove, is the cost of the single mode laser used, as well as the relative complexity of the mounting.

One of the aims of the present invention is thus to remedy at least one of the hereabove-mentioned disadvantages. For this purpose, the present invention provides an optical device comprising an optical source adapted to emit a light beam in a plurality of emitting wavelengths and at least one laser, each of said at least one laser comprising a holographic medium, means for injecting said light beam derived from said optical source into said at least one laser, said holographic medium being adapted to generate a laser, so as to oscillate said at least one laser in at least one oscillation mode, said at least one oscillation mode being determined by at least one excitation wavelength among the plurality of emitting wavelengths, characterised in that said optical force includes a light source simultaneously emitting in said plurality of emitting wavelengths.

In the following, said optical source comprising a light source simultaneously emitting in said plurality of emitting wavelengths will be designated as a "wide-band source". The plurality of emitting wavelengths can be simultaneously generated in a discreet or continuous way. An example of such a wide-band source is a source producing light by means of an amplified spontaneous emission process (ESA).

For example, let us assume an addressing in the wavelengths of a slave laser according to a comb of several wavelengths separated by 0.4 nm (100 GHz). In this case, it is necessary, according to the prior art hereabove mentioned, to adjust the length of the master laser with an accuracy of the order of a few Pico metres (a few GHz). According to the present invention, a wide-band source can be chosen, the width of which can be typically 0.4 nm (100 GHz), and the central wavelength of which can be adjusted around the targeted wavelength, but with an accuracy which will be only a fraction of the space between the wavelengths targeted for the slave laser.

In addition, in the advantageous case where the wide-band source emits a light beam comprising all the polarisation states, there will still be polarisation states which will not be perpendicular to the mode of the cavity, which makes possible to avoid the utilisation of a polarisation tester. In order to select a specific oscillation mode associated with said at least one wavelength, said injection means advantageously include an optical filter adapted to select at least one filtering wavelength among said plurality of emitting wavelengths. Said at least one filtering wavelength is, for example, obtained by specifying a central wavelength and space selectivity for the optical filter, these two lengths being, for example, tuneable.

In addition, in order to be able to modify said oscillation mode, said at least one filtering wavelength is variable. In addition, in order to protect said optical source against a disturbing lighting from the outside, said injection means may include, in addition, an optical isolator positioned at the output of said optical source. In addition, in order to be able to adjust the power of the beam derived from said optical source, said injection means may further include a variable attenuator. It should also be noted that in a way known per se, said laser includes an optical cavity and an amplifying medium.

In addition, in a particular embodiment, said means for injecting said light beam derived from said optical source into said at least one laser include an optical circulator. It should be noted that using such an optical circulator is advantageous for isolating said optical source from the light radiations emitted by said laser, and may make it possible not to use an optical isolator. In addition, according to another embodiment, said injection means include space switch means including at least one output and filtering means of said plurality of emitting wavelengths adapted to select at least one filtering wavelength among said plurality of emitting wavelengths, each said at least one output of said space switch means being connected to each of said lasers in order to selectively inject said light beam derived from said optical source into each of said lasers, said selection of each of said lasers, said selection of each of said lasers depending on said at least one filtering wavelength. In the latter embodiment, in the case of a plurality of said slave lasers, it is advantageous to be able to address the latter according to various wavelengths.

According to an embodiment, said filtering means are integrated in said switching means within a multiplexer-demultiplexer, preferably tuneable for adjusting the wavelengths associated to each output, as well as the space selectivity and/or a width of space selectivity. Other aims and advantages of the present invention will appear while reading the following detailed description.

BRIEF DESCRIPTION OF THE DRAWINGS

The invention will also be better understood while referring to the following drawings, wherein the same references indicate identical or similar elements.

DETAILED DESCRIPTION

Figure 1:
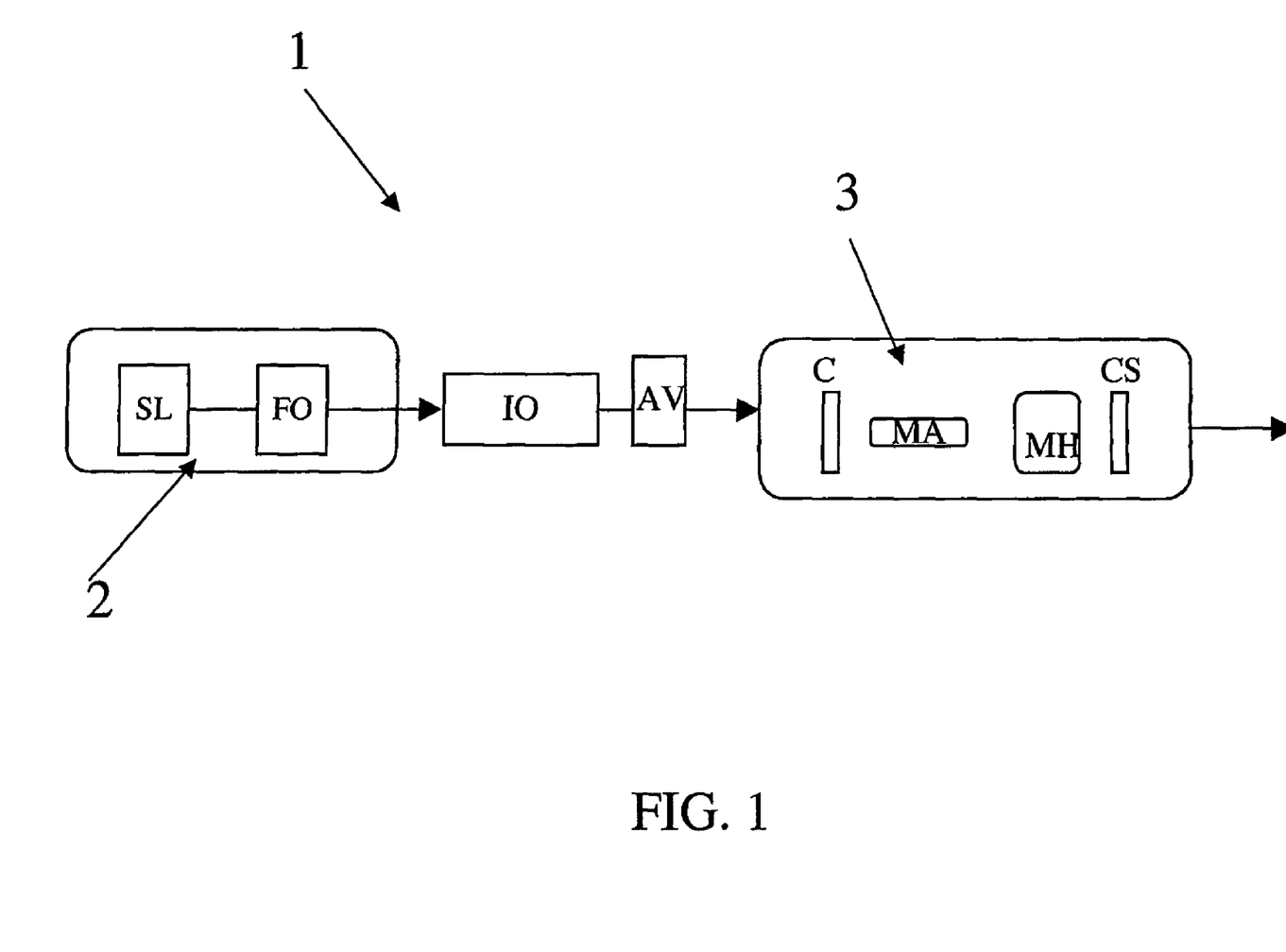
FIG. 1 shows a diagram of the device according to the present invention.

As illustrated in FIG. 1, a device 1 according to the invention is shown schematically. Such device includes a laser 3, also called in the following a "slave laser". In a way known per se, the laser 3 includes an optical cavity formed by mirrors C and CS and an amplifying medium MA. The laser 3 also includes a dynamic holographic medium MH. The wavelength of the optical cavity of the slave laser 3 is determined by the optical injection of a beam derived from an optical source 2 also called a "master source". Such master source 2 is an external light source SL having a wide-band spectrum and can be filtered using an optical filter FO.

When the beam derived from the master source is injected into the cavity of the slave laser, the spectrum emitted by the latter is modified. The new structure of modes, which oscillates in the cavity of the slave laser 3, records the hologram in the dynamic holographic medium. Such hologram reduces the losses of the mode or the modes, which oscillates or oscillate in the cavity of the slave laser 3 and makes it possible to reinforce the operation of the slave laser in a particular mode. Upon cutting off the beam derived from the master source 2, the hologram persists and enables the slave laser 3 to keep the wavelength imparted by the master source during the injection. Thus, the wavelength of the slave laser 3 is determined by the optical injection of a beam derived from a master source 2 and stored by the dynamic holographic medium inserted into the cavity of the slave laser. Such wavelength is then maintained after the cutting off of the beam emitted by the master source 2.

The slave laser includes an amplifying medium MA and a linear cavity formed by at least two mirrors C and CS, also called respectively a "coupler" and an "output coupler", inside which a dynamic holographic medium MH is inserted. The master source includes a light source having a wide-band emission spectrum SL which can be filtered using an optical filter of the band-pass type centered on a fixed or adjustable wavelength FO. The optical filter FO is optional if the source SL has the required spectral characteristics, in particular if the emitting band corresponds to the oscillation mode which is to be excited within the optical cavity 3.

The beam derived from the master source 2 is injected into the slave laser 3, either directly or after having previously passed through an optical isolator 10 which protects the master source against the external disturbing lighting and/or a variable attenuator AV which makes it possible to adjust the power of the beam derived from the master laser to be injected into the slave laser. The optical connections, which are mentioned between the various elements (black arrows in the Figures), are either in a free space or in the optical wave guides, for example, of the optical fibre type.

Figure 2:
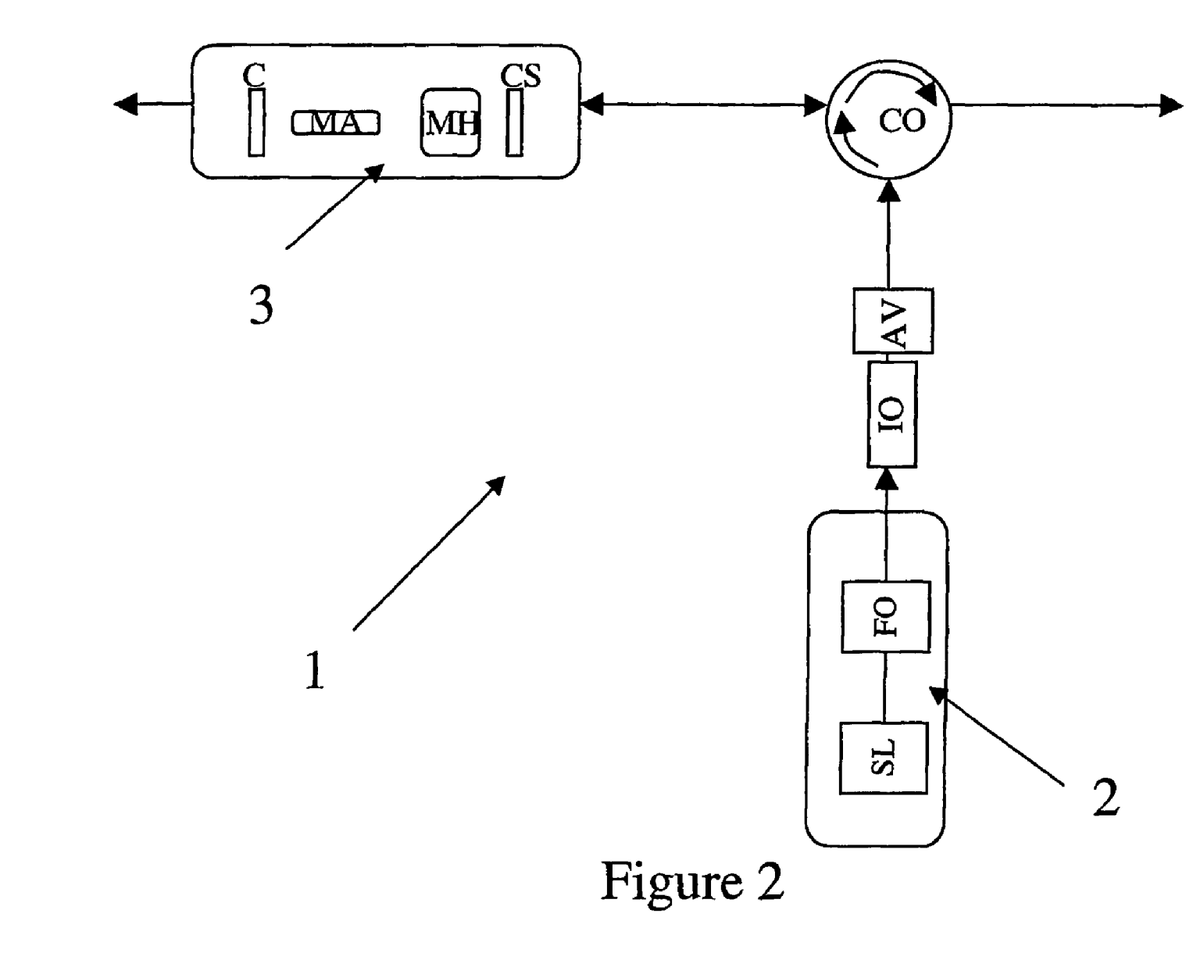
FIG. 2 shows a diagram of the device according to a first embodiment of the present invention.

Now, various advantageous embodiments of the present invention will be described. As illustrated in FIG. 2, according to a first embodiment, the injection of the beam emitted by the master source 2 into the optical cavity of the slave laser through an optical circulator CO is performed. The beam derived from the master source passes into the optical circulator CO and is then directly oriented into the slave laser 3, while being incident on the mirror CS. The laser beam produced by the slave laser can come out through the coupler C or through the output coupler CS. The beam emitted through the output coupler CS is incident on the optical circulator CO and is oriented outwards and not towards the master source. Using an optical circulator CO is particularly interesting when the coupler C of the slave laser is a highly reflective mirror. In addition, the optical circulator CO isolates the master source against the light radiations emitted by the slave laser and makes it possible not to take into account an optical isolator IO, if any, such as described hereinunder.

According to an alternative solution, the beam derived from the master source then passes into the optical circulator CO and is then directly oriented into the slave laser 3, while being incident onto the mirror C. The laser beam produced by the slave laser can go out through the coupler C or through the output coupler CS. The beam emitted through the output coupler C is incident on the optical circulator CO and is directed outwards and not towards the master source. As regards the beam emitted through the output coupler CS, it is oriented towards the outside.

Figure 3:
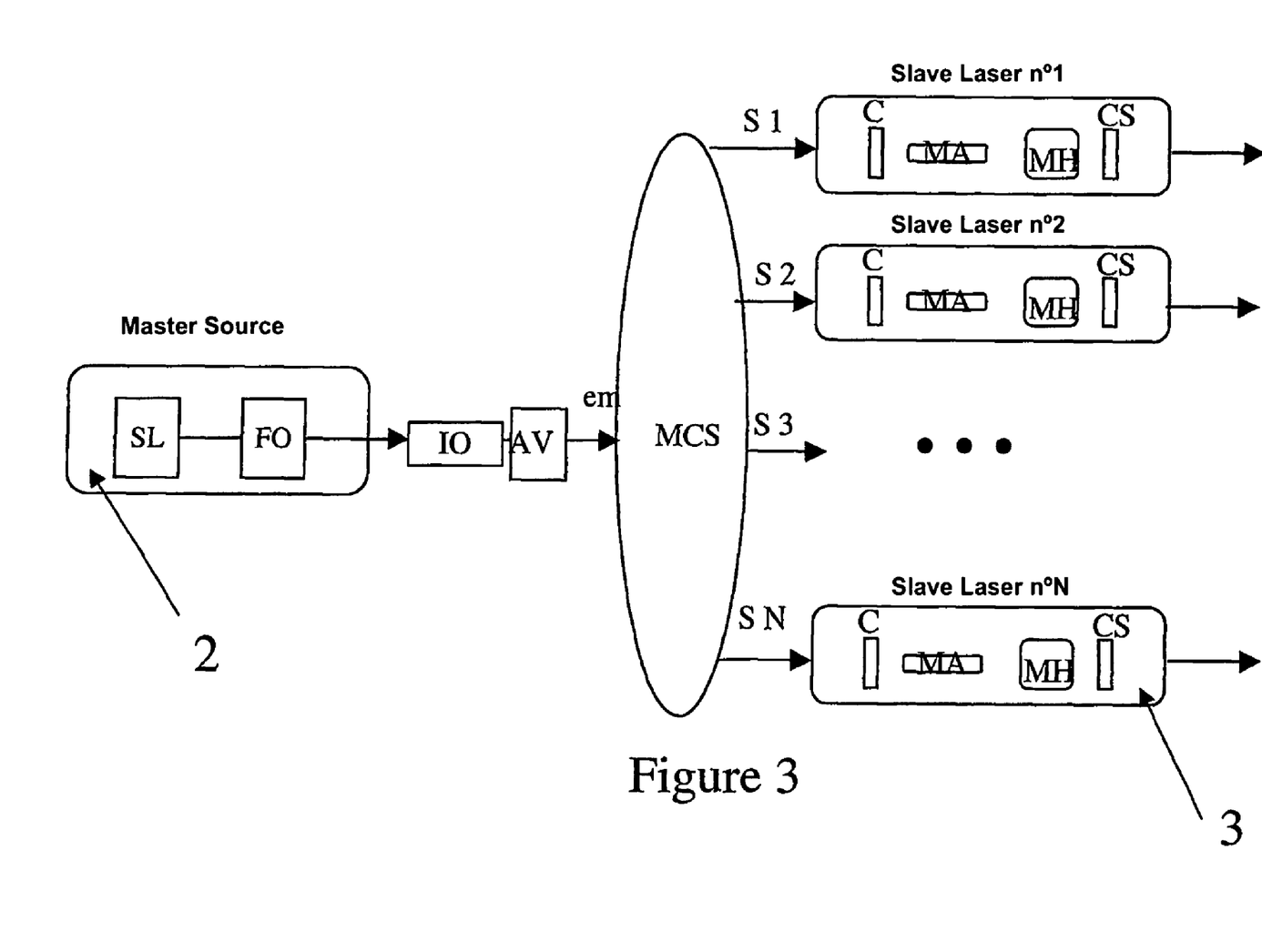
FIG. 3 shows a diagram of the device according to a second embodiment of the present invention.

According to a second embodiment illustrated in FIG. 3, the light beam resulting from the master source for the injection into various slave lasers is advantageously used. As a matter of fact, the injection time for one slave laser substantially corresponds to the time required for the holographic medium MH to be inscribed, and further to such inscription, the utilisation of the beam for another slave laser is possible, the first slave laser still oscillating in the selected mode.

Thus, according to such embodiment, the beam derived from the master source is moved towards the slave laser or lasers to be tested. For example, N slave lasers such as described hereabove are positioned, and they are all connected to the master source by means of a space switching matrix MCS. Such matrix aims at selecting an optical path for connecting the beam derived from the master laser towards one of several slave laser or lasers which is/are connected to the various outputs S1, S2, . . . SN from the matrix MCS.

Using only one master source for controlling N slave lasers is very interesting, more particularly, when the master source 2 is tuneable in wavelength, by acting for example on the optical filter FO. Each slave laser is thus addressable at various wavelengths. Such addressing is an optical one and can be reconfigured. For changing the operational wavelength of a slave laser, repeating the injection process while having beforehand tuned the master source in the neighbourhood of a new wavelength is enough. Thus, a matrix of lasers with an optical addressing of the reconfigurable wavelength is available. According to an alternative solution of such embodiment, an optical circulator CO can also be integrated between the master source and the space-switching matrix and thus take profit of the above-mentioned advantages of the optical circulator CO.

Figure 4:
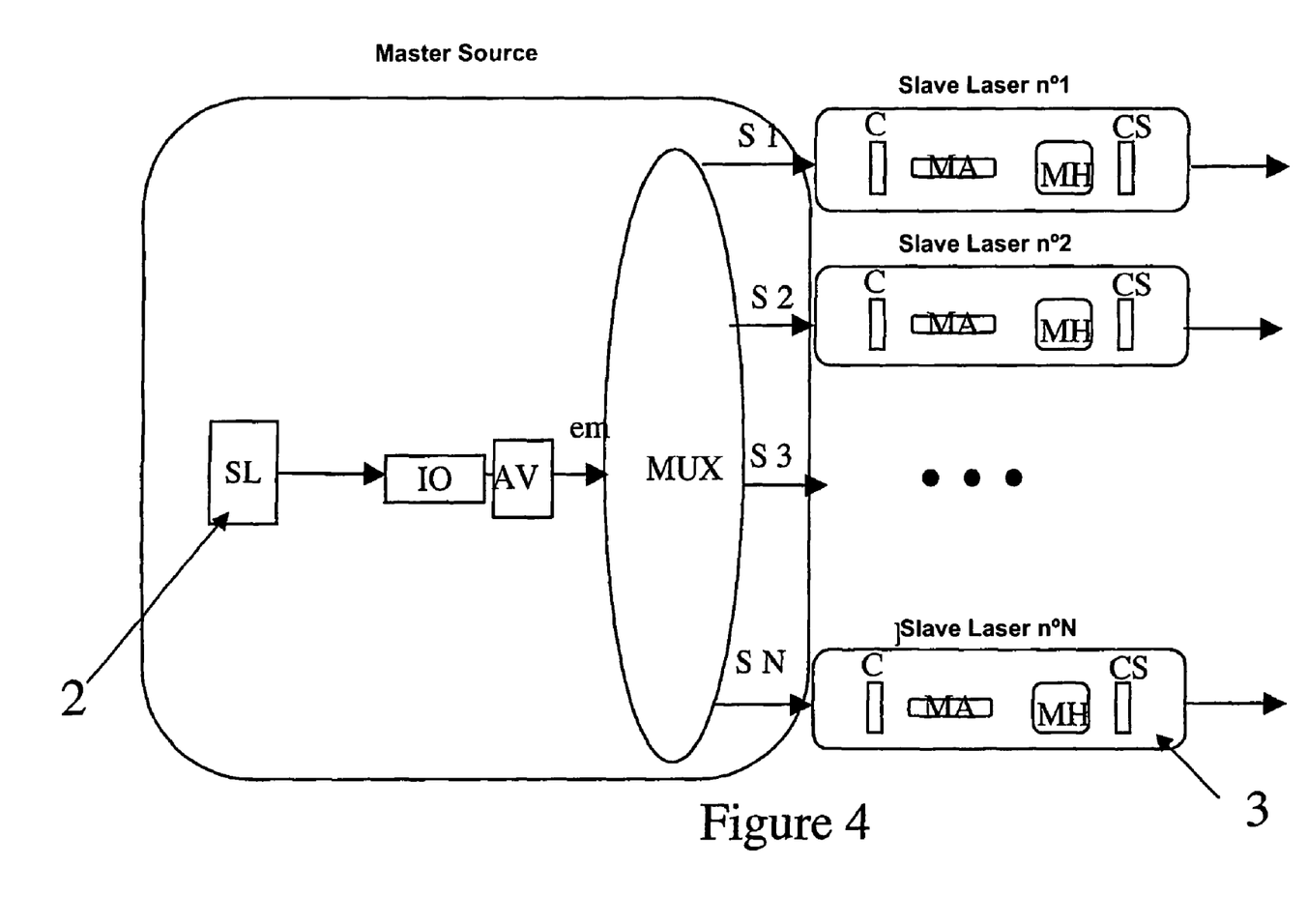
FIG. 4 shows a diagram of the device according to a third embodiment of the present invention.

As illustrated in FIG. 4 or according to another embodiment, the space-switching matrix MCS can be replaced by a multiplexer-demultiplexer MUX the function of which consists in connecting the master source to N slave lasers 3 through the output S1, S2, . . . , SN of the multiplexer-demultiplexer MUX while introducing a spectral selectivity function. The multiplexer-demultiplexer MUX also provides the function of an optical filtration of the wide-band source SL, which makes it possible, for example, to eliminate an optical filter FO, such as described hereabove.

According to an alternative embodiment previously described, an optical circulator CO can also be inserted between the wide-band source SL and the multiplexer-demultiplexer MUX. The advantages of such an optical circulator CO are the same as those mentioned hereabove.

Figure 5:
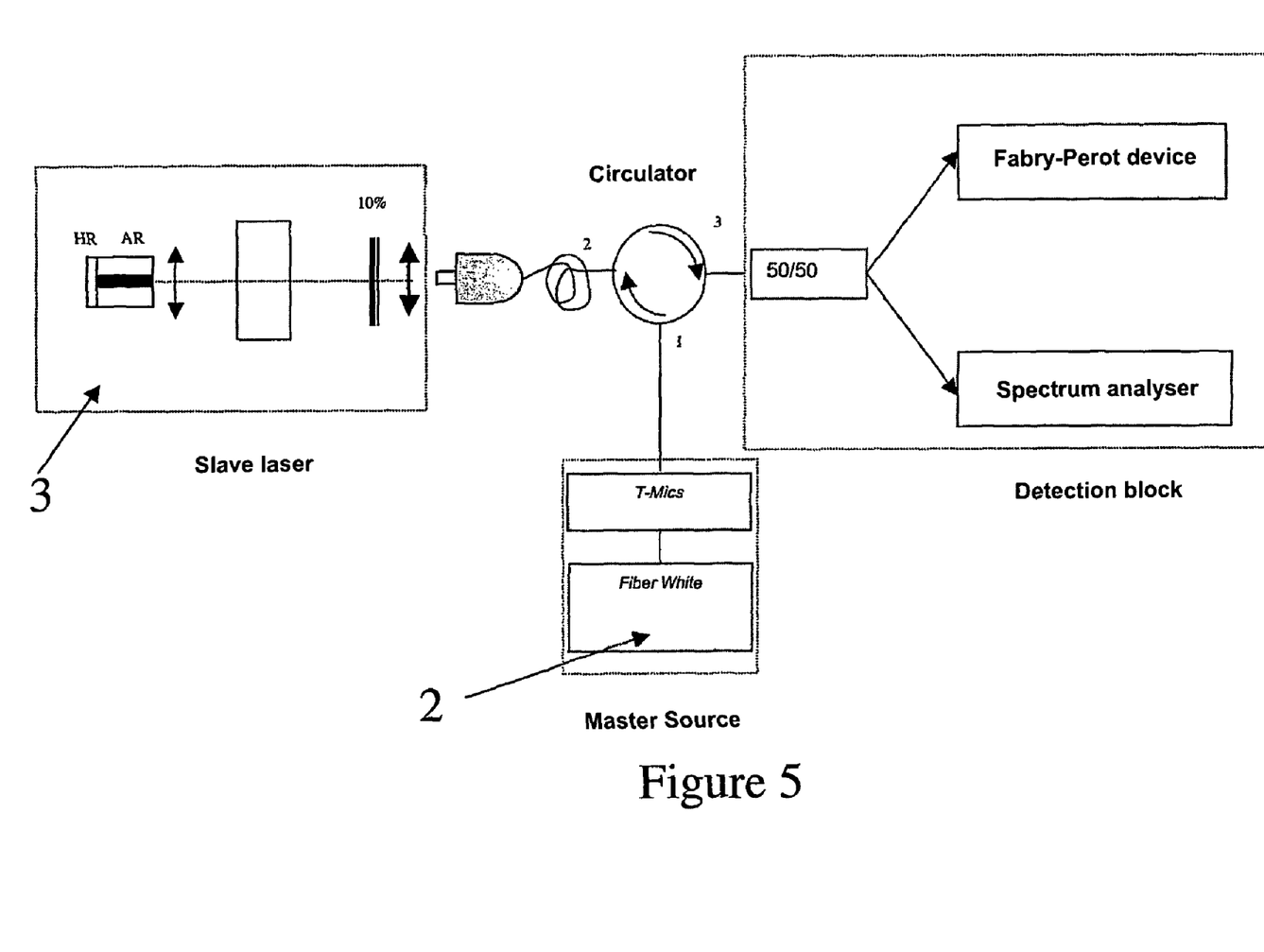
FIG. 5 shows a diagram of the device according to the invention within the scope of an experimental embodiment.
Figure 6:
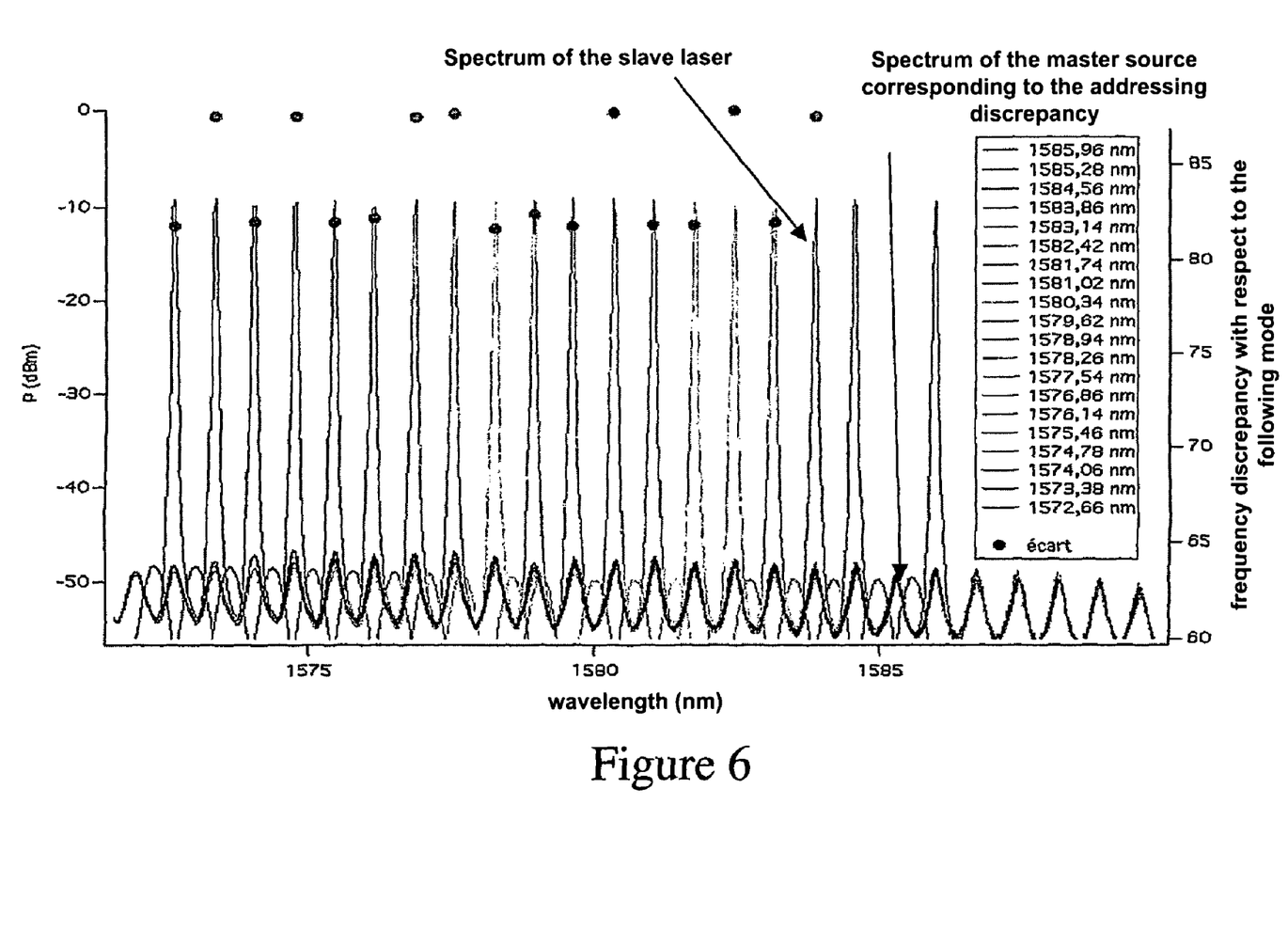
FIG. 6 shows the results of the addressing obtained by using a device according to the present invention.

As illustrated in FIGS. 5 and 6, a device according to the invention will now described, for which experimental results have been obtained. The wide band source SL used is a fibre source of the <<Amplified Spontaneous Emission>> type. It is based on the utilisation of an optical fibre doped with erbium ions pumped by means of a laser diode. The thus pumped fibre delivers, at the output, a spatially coherent beam, by emitting in the fundamental mode of the fibre, the continuous spectrum of which extends on a wide spectral band between 1565-1610 nm. It further provides a power greater than +10 dBm (10 mW). The source used is, for example, a source commercially available under the name of "Fiber White" with the "Photonetics" company. Finally, the process which the generation of the beam is based on is a spontaneous emission photon generation process, some of which are then amplified, the beam containing all the possible polarisation states.

The beam derived from the wide source SL is then filtered through an optical filter FO, the central wavelength of which can be adjusted as is the spectral width in which the filter is passing. This is a band pass type filter. For example, a demultiplexer, as used in telecommunications, can be used, as long as its particular characteristic consists in allowing an adjustment of the space between the channels (and thus, the wavelength of each filter) and the spectral width associated to the channels. Such a filter is, for example, known under the commercial trade name "Tuneable Mics" sold by the "Kylia" company. Its performances allow an adjustment of the filter width between 20 and 50 GHz and it is totally tuneable in wavelength on the bands C and L (between 1530 and 1610 nm).

It is also possible to position, following the previously described filter, a variable attenuator for controlling the power to be injected into the slave laser. An optical circulator CO is also positioned, which makes it possible to carry out both the injections from the master source into the cavity of the slave laser, and the analysis of the properties from the slave laser.

The slave laser source 3 is, for example, a laser diode source mounted in an extended cavity comprising a photorefractive crystal. It is composed of a diffraction limited laser diode and the output face of which is treated with an anti-reflection coating (residual reflection factor lower than 0.001%). It plays the part of an amplifying medium. The cavity of the laser is formed by the mirror of the back face of the diode and a distant plane mirror having a reflection coefficient around 10%. The collimation of the beam emitted by the laser diode is performed using an aspherical lens. Eventually, a Cadmium Telluride (Cd Te) photorefractive crystal is inserted between the lens and the distant mirror. The crystal constitutes a dynamic holographic medium in which a refraction index network will spontaneously develop.

The analysis of the signal at the slave laser and the master source output is carried out in two different ways using the insertion of a coupler 50/50. A Fabry-Perot device, for example marketed under the commercial name "Melles Griot", makes it possible to check the single mode characteristic of the oscillation, whereas an optical spectrum analyser, for example, marketed under the commercial name "Walics" simultaneously measures the optical spectrum associated with the master and with the slave, with a resolution of 20 pm.

In order to obtain the addressing results, the spectrum is scanned in wavelength with the wide source and all the addressed modes are recorded. FIG. 6 shows all the spectra which have been stored by the slave laser after the injection of the wide band source filtered using a tuneable filter. To each spectrum corresponds a position of the central wavelength of the accordable filter and is measured when the master-slave relationship has stopped. FIG. 6 also shows the spectrum of the wide-band source, which enables the addressing of each mode. The peaks in the wavelengths of FIG. 6 show that the addressing of a wide-band source works correctly with a device according to the present invention.

Now, an industrial application of the present invention will be described in the field of telecommunications. The device may, for example, be used as an emitter in "Passive Optical Networks" (PON). The PONS refer to the optical fibre networks which can be deployed for the so-called "access networks" which are as close to the subscribers as possible.

A device according to the present invention can offer significant improvements with respect to the solutions currently studied. Some of these solutions consist in connecting subscribers to a central by means of optical fibres, the subscriber having an emitter centered on a particular wavelength connected to the central by means of a fibre. A wavelength corresponds to each subscriber. For reasons of costs, one of the currently chosen solutions would consist in placing a laser diode of the Fabry-Perot type, at the subscriber's, which has a low spectrum quality when isolated against any external illumination. By placing, in the central, a light source of the amplified spontaneous emission (ESA) type, and connecting the output of such source to the various laser diodes placed at the subscriber's, by means of an optical circulator, which is also connected to the multiplexer-demultiplexer (MUX), it was demonstrated that each subscriber's laser diodes set around the wavelength imparted by the MUX channel which they are connected to. Such diodes are then modulated for being able to return information from the subscriber towards the central.

The disadvantage of this type of architecture is that the wavelength control of said lasers placed at the subscribers' imparts that the lasers and the ESA source should continuously be in relation. As soon as the lasers are no longer injected by this source, the appropriate spectral properties of such diodes disappear and consequently, this entails an interruption of the transmission. In addition, the fact that an ESA source is continuously present constitutes an interference for the photoreceptors. As a matter of fact, this ESA source causes disturbing light at the level of the photoreceptors, which reduces the quality of the signal to detection noise ratio which is detrimental to the quality of the transmission. Finally, the fact that each of the laser diodes is submitted to the injection through an external source of the ESA type, results in additional excessive noise on the beam being emitted by such diodes.

On the contrary, according to the present invention, it is necessary to submit said slave lasers to the injection of the beam derived from the master source only for a very short time (typically 100 ms), in order to select the wavelengths of the various slave lasers. The latter are then no longer submitted to the injection and can transmit, in a modulation mode, information from the subscribers to the central. It will be easily understood that the quality of the signal to noise ratio, at the level of the photoreceptors will thus improve: the ESA source will be absent contrary to the systems disclosed in the literature. In addition, it is expected that the beams emitted by the slave lasers have much less noise than the laser diodes submitted to the injection from an ESA source. Finally, the spectral quality noted at the level of the slave lasers (ratio of elimination of the side modes above 35 dB) results in an expected very low diaphony between the various channels associated to each subscriber.

The invention claimed is:

1. An optical device comprising a wide-band optical source adapted to emit a light beam simultaneously in a plurality of emitting wavelengths and at least one laser, each of said at least one laser including a holographic medium (MH), a light beam injector derived from said optical source in said at least one laser said holographic medium (MH) being adapted to generate a hologram so as to oscillate said at least one laser in at least one oscillation mode, said at least one oscillation mode being determined by at least one excitation wavelength among said plurality of emitting wavelengths, said injector comprising an optical filter for selecting the at least one excitation wavelength.

2. The optical device according to claim 1, wherein said at least one excitation wavelength is variable.

3. The optical device according to claim 1, wherein said injector includes an optical isolator (IO).

4. The optical device according to claim 1, wherein said injector includes a variable attenuator (AV).

5. The optical device according to claim 1, wherein said injector includes an optical circulator (CO).

6. The optical device according to claim 1, wherein said injector includes a space switch including at least one output and filter for said plurality of emitting wavelengths adapted to select at least one excitation wavelength among said plurality of emitting wavelengths, each of said at least one output of said space switch being connected to each of said at least one laser in order to selectively inject said light beam derived from said optical source into each of said at least one laser, said selection of each of said at least one laser being depending on said at least one filtering wavelength.

7. The optical device according to claim 6, wherein said space switch includes a space switch matrix.

8. The optical device according to claim 6, wherein said filter is incorporated in said switch inside a multiplexer-demultiplexer.

9. The device according to claim 1, wherein said source is an amplified spontaneous emission source.

10. An optical device comprising:
a wide-band optical source simultaneously emitting amplified spontaneous emission wavelengths;
at least one slave laser including a holographic medium being acted upon by at least one of the wavelengths; and
an optical filter obtaining at least one of the wavelengths with a desired oscillation mode to avoid use of a polarization test if the source emits all polarization states.

11. The optical device according to claim 10, wherein the optical filter is tuneable with regard to a central wavelength and space selectivity.

12. The optical device according to claim 10, further comprising a multiplexer-demultiplexer connecting the source to the at least one slave laser while introducing a spectial selectivity function.

13. The optical device according to claim 10, wherein the source is a master laser having a band width of about 0.4 nm and an accuracy of a fraction of space between the wavelengths targeted for the at least one slave laser.

14. An optical device comprising:
a wide-band master laser;
at least one slave laser comprising a holographic medium;
an optical circulator connected to at least one of the lasers;
a multiplexer connected to at least one of the lasers; and
an optical fiber carrying telecommunications signals, connected to the at least one slave laser;
the spectral quality of the at least one slave laser having a ratio of elimination of side modes above 35 dB resulting in a low diaphony between various channels associated to each subscriber.

15. The optical device according to claim 14, further comprising a tuneable optical filter associated with the master laser.

16. The optical device according to claim 15, wherein a bandwidth of the optical filter is adjustable between 20 and 50 GHz, and a wavelength is tuneable between 1530 and 1610 rm.

17. The optical device according to claim 14, wherein the at least one slave laser is submitted to injection of the beam derived from the master laser for no greater than 100 ms in order to select desired wavelengths of multiples of the slave laser.

18. The optical device according to claim 14, wherein the master laser is of an amplified spontaneous emission type.

19. The optical device according to claim 14, wherein the master laser has a band width of about 0.4 nm and an accuracy of a fraction of space between wavelengths targeted for the at least one slave laser.

* * * * *